(12) United States Patent
Lu et al.

(10) Patent No.: US 11,733,293 B2
(45) Date of Patent: Aug. 22, 2023

(54) METHOD AND APPARATUS FOR DETERMINING JITTER, STORAGE MEDIUM AND ELECTRONIC DEVICE

(71) Applicant: Changxin Memory Technologies, Inc., Anhui (CN)

(72) Inventors: Tianchen Lu, Hefei (CN); Yuan Chieh Lee, Hefei (CN)

(73) Assignee: Changxin Memory Technologies, Inc., Hefei (CN)

( * ) Notice: Subject to any disclaimer, the term of this patent is extended or adjusted under 35 U.S.C. 154(b) by 214 days.

(21) Appl. No.: 17/210,324

(22) Filed: Mar. 23, 2021

(65) Prior Publication Data

US 2021/0293878 A1    Sep. 23, 2021

Related U.S. Application Data

(63) Continuation of application No. PCT/CN2019/116151, filed on Nov. 7, 2019.

(30) Foreign Application Priority Data

Nov. 14, 2018 (CN) .......................... 201811355406.6

(51) Int. Cl.
   *G01R 31/28* (2006.01)
   *G01R 31/317* (2006.01)

(52) U.S. Cl.
   CPC ..... *G01R 31/2882* (2013.01); *G01R 31/2856* (2013.01); *G01R 31/31713* (2013.01); *G01R 31/31718* (2013.01); *G01R 31/31726* (2013.01)

(58) Field of Classification Search
   None
   See application file for complete search history.

(56) References Cited

U.S. PATENT DOCUMENTS 8,860,433 B1 * 10/2014 Chang .............. G01R 31/31709
                                              375/376
11,249,133 B2 * 2/2022 Carminati .............. G08C 15/04
(Continued)

FOREIGN PATENT DOCUMENTS

CN     1423270 A     6/2003
CN     1527302 A     9/2004
(Continued)

OTHER PUBLICATIONS

PCT International Preliminary Report on Patentability dated May 27, 2021, issued in related International Application No. PCT/CN2019/116151 (6 pages).
(Continued)

*Primary Examiner* — Jermele M Hollington
(74) *Attorney, Agent, or Firm* — Sheppard Mullin Richter & Hampton LLP

(57) ABSTRACT

A method and apparatus for determining jitter, a storage medium and an electronic device are disclosed. The method for determining jitter includes: determining a plurality of measurement time points for an output signal from an integrated circuit (IC); identifying one or more jitter points from the plurality of measurement time points by comparing the output signal with a predetermined signal at the plurality of measurement time points; and determining a jitter of the output signal of the IC based on the one or more jitter points. The jitter of the output signal of an IC chip can be determined without relying on any other additional equipment.

20 Claims, 4 Drawing Sheets

(56) References Cited

U.S. PATENT DOCUMENTS

| | | | | |
|---|---|---|---|---|
| 2007/0162240 | A1* | 7/2007 | Foster | G01R 31/31709 702/108 |
| 2008/0004821 | A1* | 1/2008 | Cranford, Jr. | G01R 31/31725 702/108 |
| 2009/0074124 | A1* | 3/2009 | Henzler | G01R 31/31709 375/371 |
| 2010/0308856 | A1* | 12/2010 | Watanabe | G01R 31/3004 324/762.01 |

FOREIGN PATENT DOCUMENTS

| | | |
|---|---|---|
| CN | 101232333 A | 7/2008 |
| CN | 103226169 A | 7/2013 |
| CN | 103312307 A | 9/2013 |
| CN | 103954912 A | 7/2014 |
| CN | 104101772 A | 10/2014 |
| CN | 105223880 A | 1/2016 |
| CN | 108551336 A | 9/2018 |
| CN | 108810286 A | 11/2018 |
| JP | 07-83979 A | 3/1995 |
| KR | 10-0283764 B | 2/2001 |
| WO | 00/27059 A1 | 5/2000 |
| WO | WO-0046606 A1 * | 8/2000 ............. G01R 29/26 |

OTHER PUBLICATIONS

First Search dated Oct. 30, 2020, issued in related Chinese Application No. 201811355406.6 (2 pages).

First Office Action dated Nov. 4, 2020, issued in related Chinese Application No. 201811355406.6, with English machine translation (10 pages).

Second Office Action dated Jun. 18, 2021, issued in related Chinese Application No. 201811355406.6, with English machine translation (12 pages).

Supplementary Search dated Oct. 13, 2021, issued in related Chinese Application No. 201811355406.6 (1 page).

PCT International Search Report and the Written Opinion dated Jan. 23, 2020, issued in related International Application No. PCT/CN2019/116151 (9 pages).

* cited by examiner

METHOD AND APPARATUS FOR DETERMINING JITTER, STORAGE MEDIUM AND ELECTRONIC DEVICE

CROSS-REFERENCE TO RELATED APPLICATIONS

This application is a continuation application of International Patent Application No. PCT/CN2019/116151, filed on Nov. 7, 2019, which is based on and claims priority of the Chinese Patent Applications No. 201811355406.6, filed on Nov. 14, 2018. The above-referenced applications are incorporated herein by reference in their entirety.

TECHNICAL FIELD

This present invention relates generally to the field of integrated circuit (IC) testing and more specifically, but not by way of limitation, to a method and apparatus for determining jitter, a storage medium and an electronic device.

BACKGROUND

Jitter describes the deviation from exact periodicity of a periodic signal, and may be regarded as a measurement of time variation of the signal. Jitter is an important factor to be considered in analog circuit design. With the advancement in electronics and communications technologies, jitter is playing an increasingly important role in digital design as well and is attracting more and more research interests.

Conventionally, jitter is often determined by measuring its waveform with an oscilloscope. However, this conventional approach requires a tester to be equipped with an internal oscilloscope or be coupled to an external oscilloscope. On the other hand, an oscilloscope typically only measures one waveform at a time and is not able to simultaneously process multiple waveforms, leading to low efficiency. Additionally, an oscilloscope usually demands complex manual configuration and operation.

It is to be noted that the information disclosed in this Background section is only for facilitating the understanding of the background of the invention and therefore may contain information that does not constitute the prior art known to a person of ordinary skill in the art.

SUMMARY

In view of the limitations of existing technologies described above, the present invention provides a method and apparatus for determining jitter, a storage medium and an electronic device that at least partially overcome the aforementioned limitations, including byzantine conventional jitter measurement practices associated with the use of an oscilloscope.

One aspect of the present invention is directed to a method for determining jitter. The method may include: repeatedly inputting an input signal to an integrated circuit and obtaining a corresponding output signal of the integrated circuit; determining a plurality of measurement time points for the output signals of the integrated circuit; identifying one or more jitter points from the plurality of measurement time points by comparing at least one of the obtained output signals with a predetermined signal at the plurality of measurement time points; and determining a jitter of the output signal of the integrated circuit based on the one or more jitter points.

In some embodiments of the present invention, identifying one or more jitter points from the plurality of measurement time points may include: comparing at least one of the obtained output signals with the predetermined signal at each of the plurality of measurement time points; determining that a measurement time point of the plurality of measurement time points is not a jitter point if the at least one of the obtained output signals is consistent with the predetermined signal at the measurement time point of the plurality of measurement time points; and determining that a measurement time point of the plurality of measurement time points is a jitter point if the at least one of the obtained output signals is inconsistent with the predetermined signal at the measurement time point of the plurality of measurement time points. The predetermined signal may be an expected output signal for an integrated circuit chip.

In some embodiments of the present invention, comparing at least one of the obtained output signal with the predetermined signal may include: comparing each of the obtained output signals with the predetermined signal at each of the plurality of measurement time points; and obtaining a statistical result at each of the plurality of measurement time points based on a comparison result of each of the obtained output signals with the predetermined signal.

In some embodiments of the present invention, determining that a measurement time point of the plurality of measurement time points is not a jitter point if the at least one of the obtained output signals is consistent with the predetermined signal at the measurement time point of the plurality of measurement time points may include: determining that the measurement time point is not a jitter point based on all the obtained output signals being consistent with the predetermined signal at the measurement time point.

In some embodiments of the present invention, comparing each of the obtained output signals with the predetermined signal at each of the plurality of measurement time points may include: determining that the measurement time point is a jitter point based on at least one of the obtained output signals being inconsistent with the predetermined signal at the measurement time point.

In some embodiments of the present invention, identifying one or more jitter points from the plurality of measurement time points may include: comparing each of the obtained output signals with the predetermined signal at each of the plurality of measurement time points; and determining whether each of the plurality of measurement time points is a jitter point based on comparison results of the obtained output signals to the predetermined signal at each measurement time point. The predetermined signal may be a predetermined threshold.

In some embodiments of the present invention, determining whether each of the plurality of measurement time points is a jitter point may include: determining that a measurement time point is not a jitter point if the comparison results of the obtained output signals to the predetermined signal at the measurement time point being identical; and determining that a measurement time point is a jitter point if the comparison results of the obtained output signals to the predetermined signal at the measurement time point being not identical.

In some embodiments of the present invention, the comparison result of one of the obtained output signals to the predetermined signal at a measurement time point may include a first result and a second result. The first result may represent the one of the obtained output signals being higher than or equal to the predetermined signal at the measurement time point, and the second result may represent the one of the obtained output signals being lower than the predetermined signal at the measurement time point.

In some embodiments of the present invention, determining a plurality of measurement time points for the output signals of the integrated circuit may include: determining a plurality of discrete time points as the plurality of measurement time points for the output signals based on a predetermined rule.

In some embodiments of the present invention, determining a plurality of measurement time points for the output signals of the integrated circuit may include: determining the plurality of measurement time points for an output voltage signal from a data strobe pin and/or a data input/output pin of a dynamic random access memory chip.

In some embodiments of the present invention, determining the plurality of measurement time points for an output voltage signal from a data strobe pin and/or a data input/output pin of a dynamic random access memory chip may include: detecting the output voltage signal from the data strobe pin or the data input/output pin of the dynamic random access memory chip; and determining the plurality of measurement time points on a rising edge or a falling edge of output voltage signal.

In some embodiments of the present invention, determining a jitter of the output signals of the integrated circuit based on the one or more jitter points may include: chronically sorting the one or more jitter points based on the corresponding measurement time points; and determining the jitter of the output signals as a time interval between an earliest jitter point and a latest jitter point.

In some embodiments of the present invention, determining a jitter of the output signals of the integrated circuit based on the one or more jitter points may include: creating a shmoo plot based on test results at the plurality of measurement time points; and determining the jitter of the output signal based on the shmoo plot.

Another aspect of the present invention is directed to an apparatus for determining jitter. The apparatus may include: a first determination module for determining a plurality of measurement time points for output signals from an integrated circuit; a comparison module for identifying one or more jitter points from the plurality of measurement time points by comparing at least one of the output signals with a predetermined signal at the plurality of measurement time points; and a second determination module for determining a jitter of the output signals of the integrated circuit based on the one or more jitter points.

In some embodiments of the present invention, the output signals may be obtained by repeatedly inputting an input signal to the integrated circuit.

In some embodiments of the present invention, to identify one or more jitter points from the plurality of measurement time points, the comparison module may be further configured to: compare at least one of the obtained output signals with the predetermined signal at each of the plurality of measurement time points; determine that the measurement time point of the plurality of measurement time points is not a jitter point if the at least one of the obtained output signals is consistent with the predetermined signal at a measurement time point of the plurality of measurement time points; and determine that the measurement time point of the plurality of measurement time points is a jitter point if the at least one of the obtained output signals is inconsistent with the predetermined signal at a measurement time point of the plurality of measurement time points. The predetermined signal may be an expected output signal for an integrated circuit chip.

In some embodiments of the present invention, to compare at least one of the obtained output signals with the predetermined signal, the comparison module may be further configured to: compare each of the obtained output signals with the predetermined signal at each of the plurality of measurement time points; and obtain a statistical result at each of the plurality of measurement time points based on a comparison result of each of the obtained output signals with the predetermined signal.

In some embodiments of the present invention, to determine that a measurement time point of the plurality of measurement time points is not a jitter point, the comparison module may be further configured to: determine that the measurement time point is not a jitter point based on all the obtained output signals being consistent with the predetermined signal at the measurement time point.

In some embodiments of the present invention, to compare each of the obtained output signals with the predetermined signal, the comparison module may be further configured to: determine that the measurement time point is a jitter point based on at least one of the obtained output signals being inconsistent with the predetermined signal at the measurement time point.

In some embodiments of the present invention, to identify one or more jitter points from the plurality of measurement time points, the comparison module may be further configured to: compare each of the obtained output signals with the predetermined signal at each of the plurality of measurement time points; and determine whether each of the plurality of measurement time points is a jitter point based on comparison results of the obtained output signals to the predetermined signal at each measurement time point. The predetermined signal may be a predetermined threshold.

In the method disclosed herein, an IC output signal can be compared with a predetermined signal at different measurement time points determined in advance to identify one or more jitter points from the measurement time points, based on which jitter of the output signal can be determined. This process does not require additional test equipment such as an oscilloscope, thus the complexity of a test and the cost of a tester can be reduced. Additionally, since manual intervention for configuring an oscilloscope is no longer necessary, human labor in a test may be substantially reduced.

It is to be understood that both the foregoing general description and the following detailed description are exemplary and explanatory only and are not restrictive of this present invention.

BRIEF DESCRIPTION OF THE DRAWINGS

The above and other features and advantages of the present invention will become more apparent from the following detailed description of exemplary embodiments thereof.

DETAIL DESCRIPTION OF THE EMBODIMENTS

Exemplary embodiments will now be described more fully with reference to the accompanying drawings. However, these exemplary embodiments can be implemented in many forms and should not be construed as being limited to those set forth herein. Rather, these embodiments are presented to provide a full and thorough understanding of the present invention and to fully convey the concepts of the exemplary embodiments to others skilled in the art. Throughout the figures, like reference numbers indicate identical or similar elements, so any duplicate description of them will be omitted.

In addition, the described features, structures, and characteristics may be combined in any suitable manner in one or more embodiments. In the following detailed description, many specific details are set forth to provide a more thorough understanding of the present invention. However, those skilled in the art will recognize that the various embodiments can be practiced without one or more of the specific details or with other methods, components, materials, or the like. In some instances, well-known structures, materials, or operations are not shown or not described in detail to avoid obscuring aspects of the embodiments.

The represented blocks in the figures are purely functional entities, which do not necessarily correspond to physically separate entities. In other words, these functional entities may be implemented as software, or entirely or in part in one or more software-hardened modules, or in different networks and/or processor devices and/or microcontroller devices.

Figure 1:
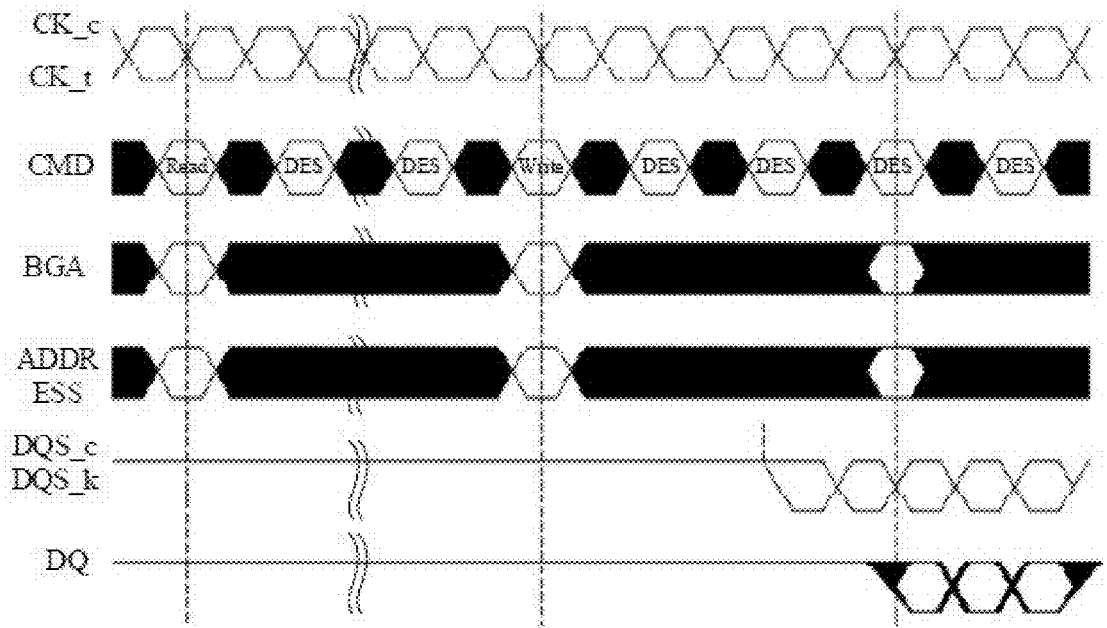
FIG. 1 is a schematic diagram of integrated circuit (IC) test signals according to the relevant art.

FIG. 1 schematically illustrates control signals input to an integrated circuit (IC) chip and voltages output from data input/output (DQ) and data strobe (DQS) pins thereof. The incoming control and address signals may include a command signal (CMD), a bank group address signal (BGA) and an address signal (ADDRESS), and the signals output from the DQS and DQ pins may be generated under the control of the input signals.

Figure 2:
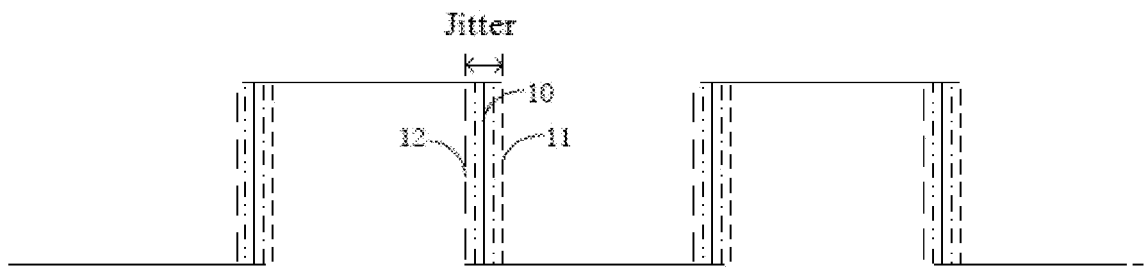
FIG. 2 is a schematic diagram illustrating jitter in an output signal according to the relevant art.

Due to noises (e.g., thermal noise, shot noise, flicker noise, burst noise, etc.) present in the chip, there is jitter in the output signals from the IC chip. As a result, an expected signal (e.g., signal 10) may be shifted (e.g., signals 11 or 12), as shown in FIG. 2. Jitter in a digital signal is defined as a deviation in position from where it would ideally be in specific times. In the field of IC chip testing, output signal jitter may refer to a time deviation of the signal from its corresponding ideal positions. Output signal jitter is an important metric for assessing the performance of an IC.

According to the present invention, the IC chip may be a dynamic random-access memory (DRAM) chip, and the output voltages may be from DQS and/or DQ pins thereof. However, it will be appreciated that the method of the present invention may also be applied to other signals in addition to those mentioned herein.

The present invention first provided a method for determining jitter. This method can be implemented by a processing unit in a tester and thus may determine a jitter without resorting to an oscilloscope. This method, however, can also be implemented by other processing unit external to a tester, and the present invention is not particularly limited in this regard.

Figure 3:
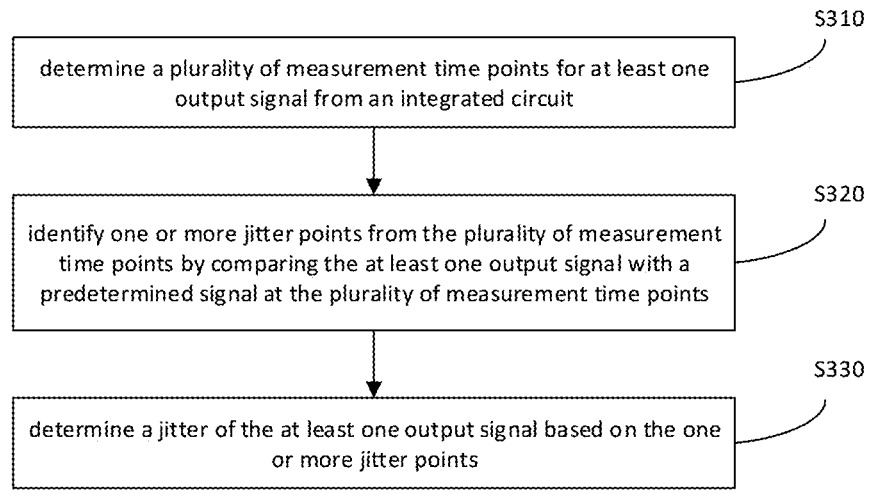
FIG. 3 is a flow chart illustrating a method for determining jitter in accordance with one embodiment of the present invention.

As shown in FIG. 3, a method for determining jitter according to embodiments of the present invention may include the following steps S310 through S330.

In step S310, a plurality of measurement time points for at least one output signal from an IC may be determined.

In step S320, one or more jitter points may be identified from the plurality of measurement time points by comparing the at least one output signal with a predetermined signal at the plurality of measurement time points.

In step S330, a jitter of the at least one output signal of the IC based may be determined based on the one or more jitter points.

In this method for determining jitter according to the present invention, an IC output signal can be compared with a predetermined signal at different measurement time points chosen in advance in order to identify one or more jitter points from the measurement time points. A jitter of the output signal can be determined based on the one or more jitter points. This method for determining jitter according to the present invention does not require additional test equipment such as an oscilloscope, thus the complexity of a test and the cost of a tester can be reduced. Additionally, since manual intervention for configuring an oscilloscope is no longer necessary, human labor in a test may be substantially reduced.

Various steps of the method for determining jitter according to embodiments of the present invention will be described in greater detail below.

In step S310, a plurality of measurement time points may be determined for the IC output signal.

In an exemplary embodiment of the present invention, a working voltage may be applied to the IC chip from the tester. As a result, a signal may be output from the IC chip as required by the test procedure. In other words, the signal may be output in one-to-one correspondence with the applied working voltage. In practical application, other physical properties such as current or frequency may also be utilized to determine the jitter of the output signal, and in such scenarios, the output signal may be similarly obtained in one-to-one correspondence with the working current or frequency. The present invention is not particularly limited in this regard.

The determined measurement time points may be either continuous or discrete points. For example, in case of the time points being discrete, an operator may schedule the measurement time points in accordance with the test requirements. In this case, the tester may obtain the output signal from the IC chip and determine the plurality of measurement time points for the signal based on a configuration pre-defined by the operator. For example, 50 measurement time points spaced at a constant interval of 20 ms within a total period of time of one second may be chosen. The configuration pre-defined by the operator may be stored on the tester and retrieved thereby when required to schedule measurement time points for determining jitter. In addition, the configuration may be modified by the operator to adapt to various output signals, test scenarios, accuracy requirements, etc., and the present invention is not particularly limited in this regard.

In one example, an IC chip under test may be a DRAM chip, the tester may detect an output signal at a DQS or DQ pin of the chip and then determine a plurality of measurement time points for the output signal. In particular, since jitter often occurs on transition edges of a signal, the measurement time points may be chosen on a rising edge or a falling edge of the output signal.

In step S320, one or more jitter points may be identified from the plurality of measurement time points by comparing the output signal with a predetermined signal at the plurality of measurement time points.

According to one embodiment of the present invention, the predetermined signal may be an expected ideal output signal corresponding to an input signal provided to the IC chip under test. For each of the measurement time points, the input signal may be input and a comparison may be made between the output signal and the expected ideal output signal at the specific measurement time point. For example, if 10 measurement time points are chosen, the input signal may be repeatedly input ten times, and at each time, a determination may be made on one of the measurement time points to determine whether that measurement time point is a jitter point.

Whether a measurement time point is a jitter point may be determined according to the following rule: if the output signal is consistent with the predetermined signal at a measurement time point, then that measurement time point is not a jitter point; and if the output signal is inconsistent with the predetermined signal at a measurement time point, then that measurement time point is a jitter point.

In practice, the output signal will be considered to be "consistent with" the predetermined signal either when it is identical to the predetermined signal or when a difference from the predetermined signal is within a permitted range, without departing from the scope of the present invention. For instance, in case of an output signal being a voltage signal, the output signal may be considered to be consistent with a predetermined signal if it differs from the predetermined signal by a value in a range of −0.1 V to 0.1 V. In practical applications, the allowable difference range may be determined by the operator according to a test requirement.

Further, in order to ensure accuracy, for each of the measurement time points, the output signal may be measured and compared with the predetermined signal multiple times.

For each of the measurement time points, in order to minimize false positive, which may result if the output signal is measured only once, the same input signal may be repeatedly input to obtain multiple output signals, so that multiple comparisons may be made between the obtained output signals with the predetermined signal. In this case, a counter may be used to allow a statistical determination.

In some embodiments of the present invention, the predetermined signal may be a threshold predetermined in relation to the expected output signal for the IC chip. For example, the expected output signal may be a voltage signal with a level in a range of 1-2 V. For example, the predetermined threshold may be 1.5 V.

For each of the measurement time points, the tester may repeatedly input the input signal to the IC chip so that the output signal can be measured a plurality of times at the specific measurement time point.

Based on the measurements, the output signal may be compared with the predetermined signal.

If the comparison results are identical, then it can be determined that the measurement time point is not a jitter point. If the comparison results are not identical, the measurement time point can be determined as a jitter point.

For each of the comparison results, if the output signal is higher than or equal to the predetermined signal, then it may be a first type (e.g., a first result). Otherwise, if the output signal is lower than the predetermined signal, then the comparison result may be a second type (e.g., a second result).

Figure 4:
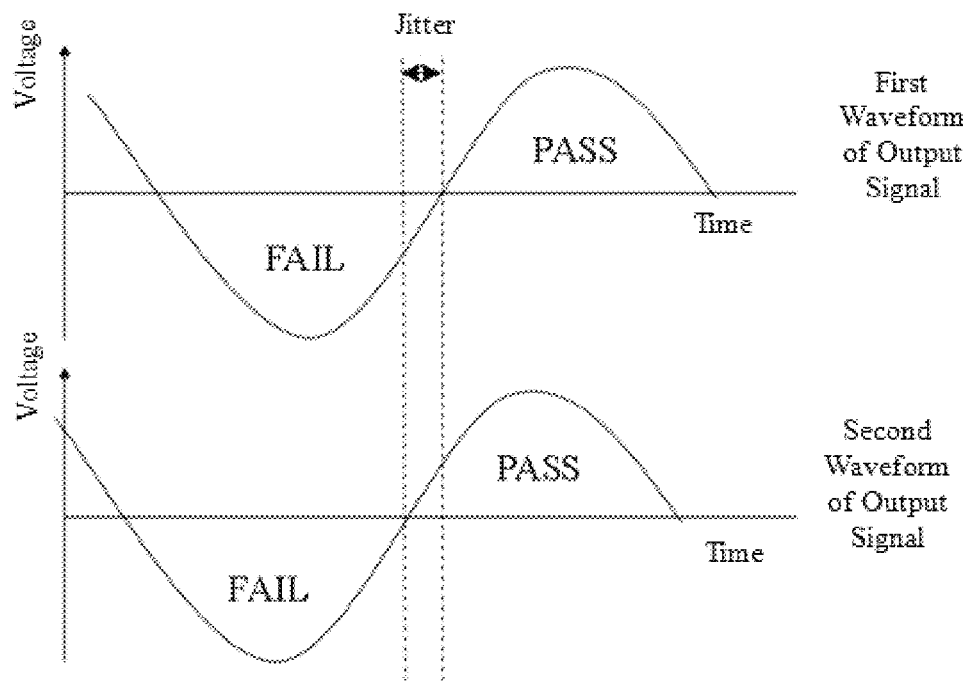
FIG. 4 is a schematic diagram of waveforms of an output signal in accordance with one embodiment of the present invention.
Figure 5:
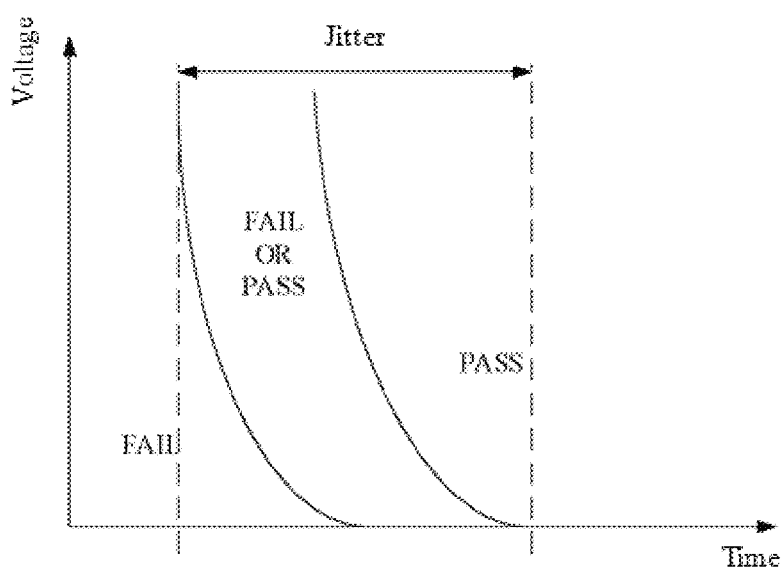
FIG. 5 is a schematic diagram showing the determination of jitter in accordance with one embodiment of the present invention.

As an example, FIG. 4 shows waveforms of the output signal after the input signal is input to the IC chip for the first and second times. In FIG. 4, the y-position of the horizontal axis may represent the predetermined threshold. In this case, a measurement of the output signal above or at the horizontal axis will result in a comparison result of the first type, and a measurement of the output signal below the axis will result in a comparison result of the second type. In the shown example, any measurement time point with different comparisons can be identified as a jitter point. Comparisons obtained from the repeated measurements at the plurality of measurement time points can be plotted, as shown in FIG. 5. In FIG. 5, the comparison results located in the left region are all of the first type (FAIL), and those located in the right region are all of the second type (PASS). The central region between the left region and the right region may be referred to as jitter region, which may include comparison results of both the first type (FAIL) and the second type (PASS). From this central region, the jitter can be determined.

In step S330, a jitter of the output signal from the IC may be determined based on the one or more jitter points.

The one or more jitter points may be chronically sequenced, and a jitter may be determined as a time interval between the earliest jitter point and the latest jitter point in the sequence. That is, the jitter can be determined as the time span between the earliest and the latest jitter points in a chronically sorted sequence of the one or more jitter points identified in step S320.

Figure 6:
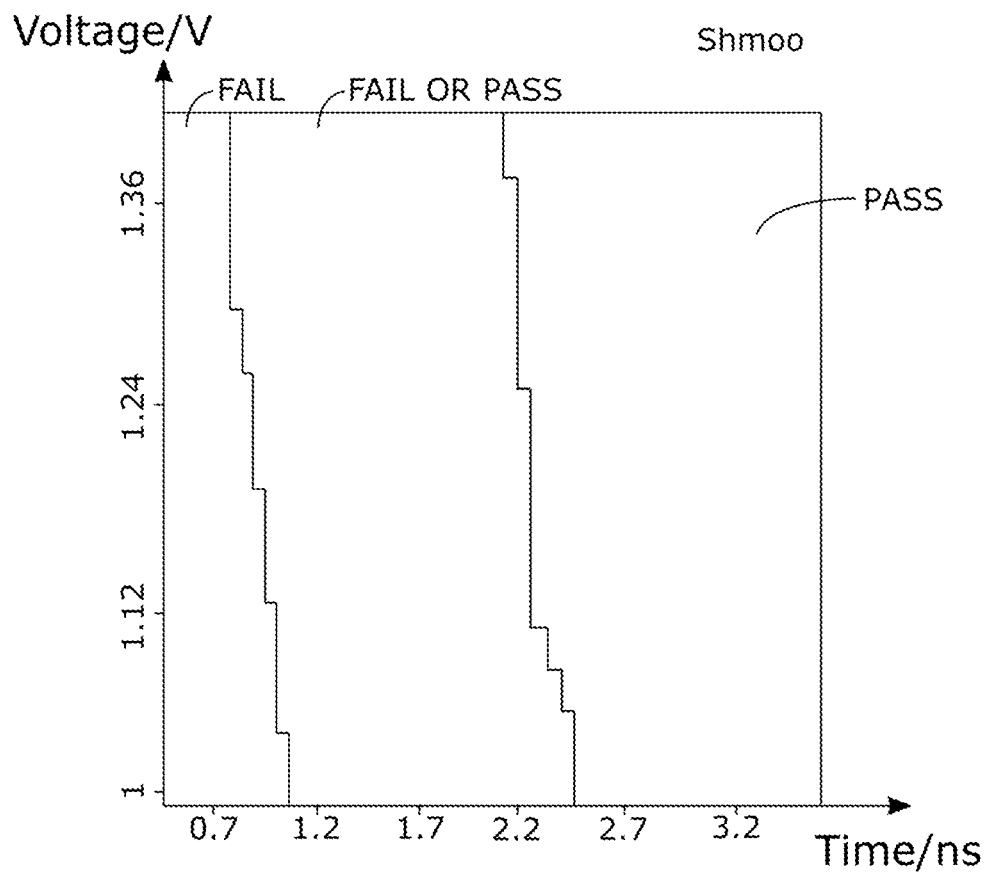
FIG. 6 is a graph schematically illustrating a shmoo plot for determining jitter in accordance with one embodiment of the present invention.

In practice, a shmoo test function of the tester may be used to create a shmoo plot from the above test results. The shmoo plot may be created by applying a criterion to the test result data so that the data are mapped to coordinates representing, for example, "PASS" or "FAIL". For example, FIG. 6 shows a shmoo plot for an exemplary test. In FIG. 6, the data mapped to the left region represent "FAIL", and those in the right region represent "PASS". In addition, some of the data mapped to the central region between the aforesaid two regions represent "FAIL", while the others represent "PASS". From this central region, the jitter can be determined. For example, for a working voltage of 1 V, the jitter may be 1.5 ns (2.50 ns minus 1.00 ns).

The method for determining jitter according to the present invention allows high automation and requires only one parameter and program configuration operation, thus the required test time may be reduced. Moreover, it provides intuitive and informative test results which can facilitate further data analysis.

It is to be noted that while the steps in the method of the present invention are illustrated in a particular order in the accompanying drawings, this is not intended to require or imply that the steps must be performed in the order presented, or that the desired benefits can only be achieved when all the steps are performed. Additionally or alternatively, one or more of the steps can be omitted, and/or some of them can be combined into a single step, and/or a certain step can be divided into multiple steps.

Figure 7:
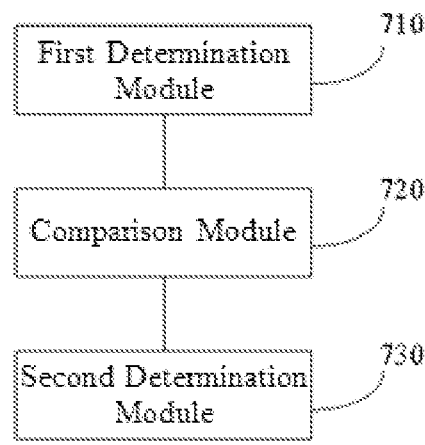
FIG. 7 is a block diagram of an apparatus for determining jitter in accordance with one embodiment of the present invention.

The present invention further provides an apparatus for determining jitter. As shown in FIG. 7, the apparatus may include a first determination module 710, a comparison module 720, and a second determination module 730.

The first determination module 710 may be configured to determine a plurality of measurement time points for an output signal from an IC, the comparison module 720 may be configured to identify one or more jitter points from the plurality of measurement time points by comparing the output signal with a predetermined signal at the plurality of measurement time points, and the second determination module 730 may be configured to determine the jitter of the output signal based on the one or more jitter points.

In this apparatus, an IC output signal can be compared by the comparison module 720 with a predetermined signal at different measurement time points chosen in advance by the first determination module 710 in order to identify one or more jitter points from the time points. Based on the one or more jitter points, a jitter of the output signal can be determined by the second determination module 730. This process does not require additional test equipment such as an oscilloscope, thus the complexity of a test and the cost of a tester can be reduced. Additionally, since manual intervention for configuring an oscilloscope is no longer necessary, human labor in a test may be substantially reduced.

Since the features of the various modules in the apparatus are the same as those of the corresponding steps in the aforementioned method embodiments, a further description thereof is believed unnecessary and omitted here for the sake of conciseness.

It should be noted that although several modules or units of the apparatus have been discussed in the detailed description above, the boundaries between them need not be as discussed. Indeed, in accordance with embodiments of the present invention, the features and functions of two or more modules or units described above may be embodied in one module or unit. Conversely, the features and functions of one of the modules or units described above may be further divided into multiple modules or units.

The present invention further provides an electronic device capable of implementing the method as described above.

As will be appreciated by one skilled in the art, aspects of the present invention may be embodied as a system, method or program product. Accordingly, aspects of the present invention may take the form of an entirely hardware embodiment, an entirely software embodiment (including firmware, micro-code, etc.) or an embodiment combining software and hardware aspects that may all generally be referred to herein as a "circuit," "module" or "system".

Figure 8:
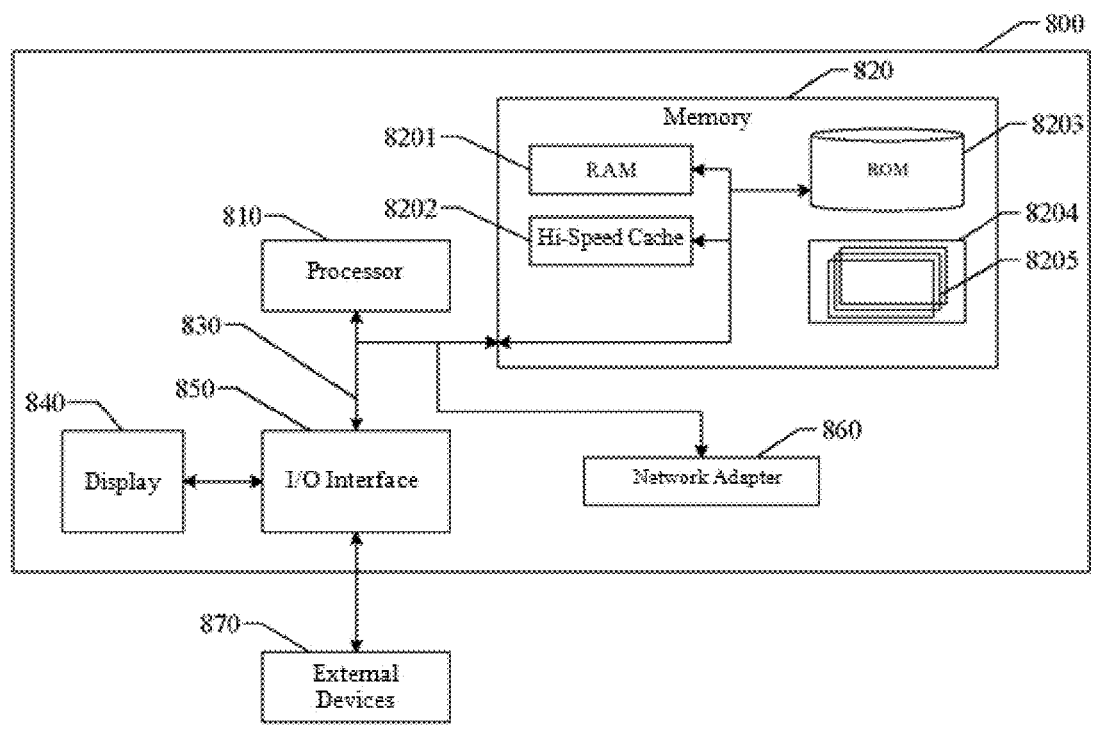
FIG. 8 is a block diagram of an electronic device in accordance with one embodiment of the present invention.

FIG. 8 is a block diagram of an electronic device in accordance with one embodiment of the present invention. The electronic device 800 according to such embodiments of the present invention will be described below with reference to FIG. 8. The electronic device 800, as shown in FIG. 8, is only one example and is not intended to suggest any limitation as to the scope of use or functionality of embodiments of the invention described herein.

As shown in FIG. 8, the electronic device 800 may be implemented as a general-purpose computing device. The components of the electronic device 800 may include, but not be limited to, one or more processors 810, at least one memory 820, a bus 830 that couples to various system components (including the memory 820 and the processors 810) and a display 840.

The memory 820 may store thereon program code that can be executed by the processors 810 to cause the processors 810 to perform the steps according to the various exemplary embodiments described in the aforementioned method embodiments.

The memory 820 may include a readable medium in the form of a volatile memory, such as a random-access memory (RAM) 8201 and/or a high-speed cache memory 8202, as well as a read only memory (ROM) 8203.

The memory 820 may further include a program/utility 8204 having a set (at least one) of program modules 8205. Such program modules 8205 may include, but not be limited to, an operating system, one or more application programs, other program modules and program data. Each of the operating system, one or more application programs, other program modules, and program data or some combination thereof, may include an implementation of a networking environment.

The bus 830 may represent one or more of any of several types of bus structures, including a memory bus or memory controller, a peripheral bus, an accelerated graphics port, and a processor or local bus using any of a variety of bus architectures.

The electronic device 800 may also communicate with one or more external devices 870 (e.g., a keyboard, a pointing device, a Bluetooth device), one or more devices that enable a user to interact with the electronic device 800 and/or any devices (e.g., router, modem) that enable the electronic device 800 to communicate with one or more other general-purpose computing devices. Such communication can occur via input/output (I/O) interfaces 850. Still yet, the electronic device 800 may communicate with one or more networks (e.g., a local area network (LAN), a general wide area network (WAN), and/or a public network such as the Internet) via a network adapter 860. As depicted, the network adapter 860 may communicate with the other components of the electronic device 1600 via the bus 830. It should be understood that, although not shown, other hardware and/or software components could be used in conjunction with the electronic device 800. Examples include, but are not limited to: microcode, device drivers, redundant processing units, external disk drive arrays, RAID systems, tape drives, and data archival storage systems, etc.

From the description of the above embodiments, it will be readily appreciated by those skilled in the art that the exemplary embodiment disclosed herein may be implemented either by software or by software in combination with necessary hardware. Therefore, the embodiments of the present invention can be embodied in a software product which may be stored in a non-volatile storage medium (e.g., a CD-ROM, USB flash drive, portable hard drive) or in a network and may include a number of instructions for causing a computing device (e.g., a PC, server, touch terminal, network device) to implement the method of the present invention.

The present invention further provides a computer-readable storage medium storing thereon a program product capable of implementing the method as defined hereinabove. In some possible embodiments, various aspects of the present invention may also be implemented in the form of a program product including program code for causing a terminal device, on which the program product is running, to perform the steps according to the various exemplary embodiments described in the aforementioned method embodiments.

Figure 9:
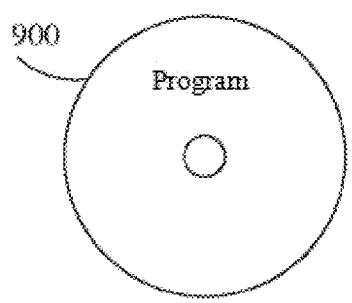
FIG. 9 is a schematic diagram of a storage medium in accordance with one embodiment of the present invention.

FIG. 9 illustrates a program product 900 for implementing the above method in accordance with one or more embodiments of the present invention. The program product 900 may be provided as a portable compact disk read only memory (CD-ROM) containing program code that can be run on a terminal device such a personal computer (PC). However, the program product of the present invention is not limited thereto, as the readable storage medium herein may be any tangible medium that can contain, or store a program for use by or in connection with an instruction execution system, apparatus, or device.

The program product may be implemented as any combination of one or more readable media each in the form of a readable signal medium or a readable storage medium. For example, the readable storage medium may be, but not limited to, an electronic, magnetic, optical, electromagnetic, infrared, or semiconductor system, apparatus, or device, or any suitable combination of the foregoing. More specific examples (a non-exhaustive list) of the readable storage medium may include the following: an electrical connection having one or more wires, a portable computer diskette, a hard disk, a random access memory (RAM), a read-only memory (ROM), an erasable programmable read-only memory (EPROM or Flash memory), an optical fiber, a CD-ROM, an optical storage device, a magnetic storage device, or any suitable combination of the foregoing.

The computer-readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. The readable signal medium may also be any readable medium that is not a readable storage medium and that can communicate, propagate, or transport a program for use by or in connection with an instruction execution system, apparatus, or device.

Program code embodied on the computer readable medium may be transmitted using any appropriate medium, including but not limited to wireless, wireline, optical fiber cable, RF, etc., or any suitable combination of the foregoing.

Program code for performing operations of the present invention may be written in any combination of one or more programming languages, including an object-oriented programming language such as Java, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on a remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Further, the annexed figures are merely illustrative of a series of processes included in the method according to exemplary embodiments of the present invention and are not intended to be limiting. It will be readily appreciated that the way in which the processes are illustrated does not indicate any chronological order of them or limit them to a particular chronological order. Furthermore, it will also be readily appreciated that the processes may be performed, for example, synchronously or asynchronously in multiple modules.

Other embodiments of the present invention will be apparent to those skilled in the art from considering the specification and practicing the invention disclosed herein. Accordingly, this present invention is intended to cover all and any variations, uses, or adaptations of the present invention which follow, in general, the principles thereof and include such departures from the present invention as come within common knowledge or customary practice within the art to which the invention pertains. It is also intended that the specification and examples be considered as exemplary only, with true scope and spirit of the present invention being indicated by the appended claims.

It is to be understood that the present invention is not limited to the exact structures as described above and illustrated in the figures and may be modified or changed without departing from its scope. The scope of the present invention is intended to be defined only by the appended claims.

The invention claimed is:

1. A method for determining jitter, comprising:
repeatedly inputting an input signal to an integrated circuit and obtaining a corresponding output signal of the integrated circuit;
determining a plurality of measurement time points for the output signals of the integrated circuit;
identifying, by comparing at least one of the obtained output signals with a predetermined signal at the plurality of measurement time points, one or more jitter points from the plurality of measurement time points; and
determining, based on the one or more jitter points, a jitter of the output signals of the integrated circuit,
wherein identifying one or more jitter points from the plurality of measurement time points comprises:
comparing, at each of the plurality of measurement time points, at least one of the obtained output signals with the predetermined signal;
determining, in response to that the at least one of the obtained output signals is consistent with the predetermined signal at a first measurement time point of the plurality of measurement time points, that the first measurement time point of the plurality of measurement time points is not a jitter point; and
determining, in response to that the at least one of the obtained output signals is inconsistent with the predetermined signal at a second measurement time point of the plurality of measurement time points, that the second measurement time point of the plurality of measurement time points is the jitter point,
wherein the predetermined signal is an expected output signal for the integrated circuit.

2. The method of claim 1, wherein comparing at least one of the obtained output signals with the predetermined signal comprises:
comparing, at each of the plurality of measurement time points, each of the obtained output signals with the predetermined signal; and
obtaining, based on a comparison result of each of the obtained output signals with the predetermined signal, a statistical result for the plurality of measurement time points.

3. The method of claim 2, wherein determining, in response to that the at least one of the obtained output signals is consistent with the predetermined signal at the first measurement time point of the plurality of measurement time points, that the first measurement time point of the plurality of measurement time points is not the jitter point comprises:
determining, based on all the obtained output signals being consistent with the predetermined signal at the first measurement time point, that the first measurement time point is not the jitter point.

4. The method of claim 3, wherein comparing, at each of the plurality of measurement time points, each of the obtained output signals with the predetermined signal comprises:
determining, based on at least one of the obtained output signals being inconsistent with the predetermined signal at the measurement time point, that the measurement time point corresponding to the at least one of the obtained output signals is the jitter point.

5. The method of claim 1, wherein identifying one or more jitter points from the plurality of measurement time points comprises:
comparing, at each of the plurality of measurement time points, each of the obtained output signals with the predetermined signal; and
determining, based on comparison results of the obtained output signals to the predetermined signal at each measurement time point, whether each of the plurality of measurement time points is a jitter point,
wherein the predetermined signal is a predetermined threshold.

6. The method of claim 5, wherein determining whether each of the plurality of measurement time points is the jitter point comprises:
determining, in response to the comparison results of the obtained output signals being identical to the predetermined signal at a measurement time point, that the measurement time point is not the jitter point; and
determining, in response to the comparison results of the obtained output signals being not identical to the predetermined signal at the measurement time point, that the measurement time point is the jitter point.

7. The method of claim 6, wherein the comparison results of one of the obtained output signals to the predetermined signal at the measurement time point comprises a first result and a second result, the first result representing the one of the obtained output signals being higher than or equal to the predetermined signal at the measurement time point, the second result representing the one of the obtained output signals being lower than the predetermined signal at the measurement time point.

8. The method of claim 1, wherein determining the plurality of measurement time points for the output signals of the integrated circuit comprises:
determining, based on a predetermined rule, a plurality of discrete time points as the plurality of measurement time points for the output signals.

9. The method of claim 1, wherein determining the plurality of measurement time points for the output signals of the integrated circuit comprises:
determining the plurality of measurement time points for an output voltage signal from a data strobe pin and/or a data input/output pin of a dynamic random-access memory chip.

10. The method of claim 9, wherein determining the plurality of measurement time points for the output voltage signal from the data strobe pin and/or the data input/output pin of the dynamic random-access memory chip comprises:
detecting the output voltage signal from the data strobe pin or the data input/output pin of the dynamic random-access memory chip; and
determining the plurality of measurement time points on a rising edge or a falling edge of the output voltage signal.

11. The method of claim 1, wherein determining, based on the one or more jitter points, the jitter of the output signals of the integrated circuit comprises:
chronically sorting the one or more jitter points based on the corresponding measurement time points; and
determining the jitter of the output signals as a time interval between an earliest jitter point and a latest jitter point.

12. The method of claim 1, wherein determining, based on the one or more jitter points, the jitter of the output signals of the integrated circuit comprises:
creating, based on test results at the plurality of measurement time points, a shmoo plot; and
determining, based on the shmoo plot, the jitter of the output signals.

13. An apparatus for determining jitter, comprising a processor and a memory device configured to store computer instructions executable by the processor, wherein the processor is configured to execute the computer instructions to perform operations comprising:
repeatedly inputting an input signal to an integrated circuit and obtaining a corresponding output signal of the integrated circuit;
determining a plurality of measurement time points for the output signals of the integrated circuit;
identifying, by comparing at least one of the output signals with a predetermined signal at the plurality of measurement time points, one or more jitter points from the plurality of measurement time points; and
determining, based on the one or more jitter points, a jitter of the output signals of the integrated circuit,
wherein identifying one or more jitter points from the plurality of measurement time points comprises:
comparing, at each of the plurality of measurement time points, at least one of the obtained output signals with the predetermined signal;
determining, in response to that the at least one of the obtained output signals is consistent with the predetermined signal at a first measurement time point of the plurality of measurement time points, that the first measurement time point of the plurality of measurement time points is not a jitter point; and
determining, in response to that the at least one of the obtained output signals is inconsistent with the predetermined signal at a second measurement time point of the plurality of measurement time points, that the second measurement time point of the plurality of measurement time points is the jitter point,
wherein the predetermined signal is an expected output signal for the integrated circuit.

14. The apparatus of claim 13, wherein comparing at least one of the obtained output signals with the predetermined signal comprises:
comparing, at each of the plurality of measurement time points, each of the obtained output signals with the predetermined signal; and
obtaining, based on a comparison result of each of the obtained output signals with the predetermined signal, a statistical result for the plurality of measurement time points.

15. The apparatus of claim 14, wherein determining, in response to that the at least one of the obtained output signals is consistent with the predetermined signal at the first measurement time point of the plurality of measurement time points, that the first measurement time point of the plurality of measurement time points is not the jitter point comprises:

determining, based on all the obtained output signals being consistent with the predetermined signal at the first measurement time point, that the first measurement time point is not the jitter point.

16. The apparatus of claim 15, wherein comparing each of the obtained output signals with the predetermined signal comprises:
    determining, based on at least one of the obtained output signals being inconsistent with the predetermined signal at the measurement time point, that the measurement time point corresponding to the at least one of the obtained output signals is the jitter point.

17. The apparatus of claim 13, wherein identifying one or more jitter points from the plurality of measurement time points comprises:
    comparing, at each of the plurality of measurement time points, each of the obtained output signals with the predetermined signal; and
    determining, based on comparison results of the obtained output signals to the predetermined signal at each measurement time point, whether each of the plurality of measurement time points is a jitter point,
    wherein the predetermined signal is a predetermined threshold.

18. The apparatus of claim 17, wherein determining whether each of the plurality of measurement time points is the jitter point comprises:
    determining, in response to the comparison results of the obtained output signals being identical to the predetermined signal at a measurement time point, that the measurement time point is not the jitter point; and
    determining, in response to the comparison results of the obtained output signals being not identical to the predetermined signal at the measurement time point, that the measurement time point is the jitter point.

19. The apparatus of claim 18, wherein the comparison results of one of the obtained output signals to the predetermined signal at the measurement time point comprises a first result and a second result, the first result representing the one of the obtained output signals being higher than or equal to the predetermined signal at the measurement time point, the second result representing the one of the obtained output signals being lower than the predetermined signal at the measurement time point.

20. The apparatus of claim 13, wherein determining the plurality of measurement time points for the output signals of the integrated circuit comprises:
    determining, based on a predetermined rule, a plurality of discrete time points as the plurality of measurement time points for the output signals.

* * * * *